(12) United States Patent
Lee et al.

(10) Patent No.: US 8,227,903 B2
(45) Date of Patent: Jul. 24, 2012

(54) INTEGRATED CIRCUIT PACKAGING SYSTEM WITH ENCAPSULANT CONTAINMENT AND METHOD OF MANUFACTURE THEREOF

(75) Inventors: Hye Ran Lee, Ichon-si (KR); Tae Keun Lee, Ichon-si (KR); Jaepil Kim, Icheon-si (KR); JungHo Seo, Icheon-si (KR)

(73) Assignee: Stats Chippac Ltd, Singapore (SG)

( * ) Notice: Subject to any disclaimer, the term of this patent is extended or adjusted under 35 U.S.C. 154(b) by 140 days.

(21) Appl. No.: 12/882,856

(22) Filed: Sep. 15, 2010

(65) Prior Publication Data
US 2012/0061859 A1    Mar. 15, 2012

(51) Int. Cl.
*H01L 23/552* (2006.01)
(52) U.S. Cl. ............... 257/659; 257/E21.502; 257/700; 257/730; 438/127
(58) Field of Classification Search ........... 257/E21.502, 257/E23.116, 659, 660, 698, 699, 700, 708, 257/730, 739, 790, 788, 717, 713, 687, 710, 257/787; 438/2, 106, 127
See application file for complete search history.

(56) References Cited

U.S. PATENT DOCUMENTS

| | | | | | |
|---|---|---|---|---|---|
| 5,166,772 | A | * | 11/1992 | Soldner et al. | 257/659 |
| 5,640,047 | A | * | 6/1997 | Nakashima | 257/738 |
| 7,035,081 | B2 | * | 4/2006 | Nagata et al. | 361/306.3 |
| 7,045,385 | B2 | * | 5/2006 | Kim et al. | 438/106 |
| 7,217,370 | B2 | * | 5/2007 | Sugimoto et al. | 216/17 |
| 7,241,414 | B2 | | 7/2007 | Ho et al. | |
| 7,279,771 | B2 | * | 10/2007 | Sunohara et al. | 257/516 |
| 7,459,765 | B2 | * | 12/2008 | Terui et al. | 257/532 |
| 7,480,153 | B2 | * | 1/2009 | Kong | 361/818 |
| 7,759,171 | B2 | | 7/2010 | Hussin et al. | |
| 7,939,907 | B2 | * | 5/2011 | Osaka et al. | 257/500 |
| 8,008,753 | B1 | * | 8/2011 | Bolognia | 257/659 |
| 8,093,690 | B2 | * | 1/2012 | Ko et al. | 257/660 |
| 8,110,902 | B2 | * | 2/2012 | Eun et al. | 257/659 |
| 2006/0076695 | A1 | | 4/2006 | Hsieh et al. | |

* cited by examiner

*Primary Examiner* — Chris Chu
(74) *Attorney, Agent, or Firm* — Ishimaru & Associates LLP; Mikio Ishimaru; Stanley Chang

(57) ABSTRACT

A method of manufacture of an integrated circuit packaging system includes: providing a substrate; forming layers having non-horizontal strip patterns and non-vertical strip patterns over the substrate; mounting an integrated circuit device on the substrate adjacent the non-horizontal strip patterns and the non-vertical strip patterns; and applying an encapsulation over the integrated circuit device, the encapsulation restricted by the layers to prevent the encapsulation from reaching an edge of the substrate.

20 Claims, 3 Drawing Sheets

INTEGRATED CIRCUIT PACKAGING SYSTEM WITH ENCAPSULANT CONTAINMENT AND METHOD OF MANUFACTURE THEREOF

TECHNICAL FIELD

The present invention relates generally to an integrated circuit packaging system, and more particularly to a system with encapsulant containment.

BACKGROUND ART

Electronic products such as cell phone base products, global positioning systems (GPS), satellites, communication equipment, consumer products, and a vast line of other similar products are in ever increasing global demand. It is very important for products to continue to improve in features, performance, and reliability while reducing product costs, product size, and to be available quickly for purchase by the consumers or buyers.

Market growth for high density and high output/input integrated circuit packages has resulted in a trend for electronic products that are lightweight, smaller in size, multi-functional, and capable of ever increasing higher speeds. Products must be capable of competing in world markets and attracting many consumers or buyers.

Smaller packages need to be electrically connected with other parts and components. As the smaller packages with more circuits continue to get shrink in size, there is a greater need to produce the smaller packages at a reduced cost with increases in product yields and product reliability.

Thus, an increasing need remains to increase manufacturing throughput and the product reliability while reducing costs as a result of manufacturing scrap and rework of parts. It is also critical that the smaller packages are easily manufactured using automated packaging machinery. Smaller packages must be able to connect to circuit boards and deliver increasing functionality, speed, and performance. In view of the economic and technological challenges, it is increasingly critical that answers be found to these problems.

In view of the ever-increasing commercial competitive pressures, along with growing consumer expectations and the diminishing opportunities for meaningful product differentiation in the marketplace, it is critical that answers be found for these problems. Additionally, the need to reduce costs, improve reliability and product yields to meet competitive pressures adds an even greater urgency to the critical necessity for finding answers to these problems.

Solutions to these problems have been long sought after but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a substrate; forming layers having non-horizontal strip patterns and non-vertical strip patterns over the substrate; mounting an integrated circuit device on the substrate adjacent the non-horizontal strip patterns and the non-vertical strip patterns; and applying an encapsulation over the integrated circuit device, the encapsulation restricted by the layers to prevent the encapsulation from reaching an edge of the substrate.

The present invention provides an integrated circuit packaging system, including: a substrate; layers having non-horizontal strip patterns and non-vertical strip patterns over the substrate; an integrated circuit device on the substrate adjacent the non-horizontal strip patterns and the non-vertical strip patterns; and an encapsulation over the integrated circuit device, the encapsulation restricted by the layers to prevent the encapsulation from reaching an edge of the substrate.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
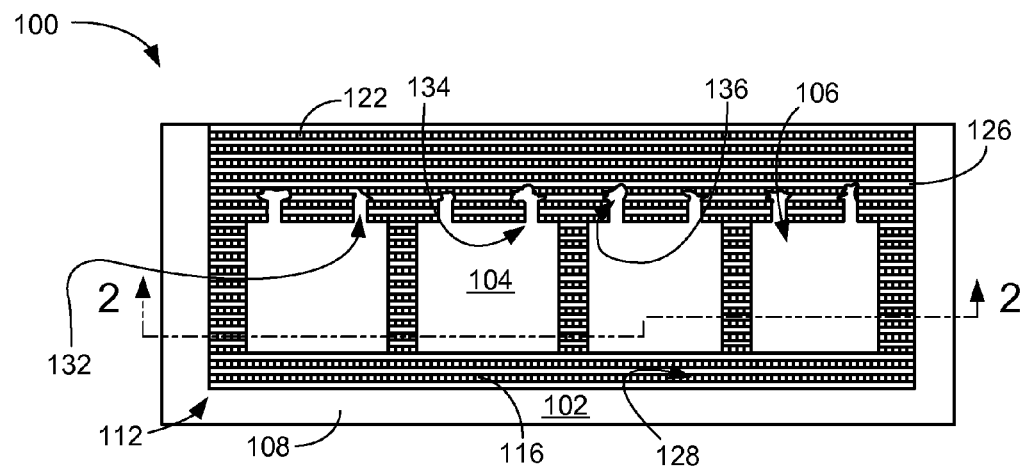
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown greatly exaggerated in the drawing FIGs. Similarly, although the views in the drawings shown for ease of description and generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the present invention, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. The integrated circuit packaging system 100 includes a substrate 102 including a copper traced substrate, an encapsulation 104 or a mold on component areas 106 of a component side 108 of the substrate 102, and layers 112 formed over portions of the component side 108 and surrounding the encapsulation 104.

The component areas 106 are defined as locations having circuitry on the component side 108. The encapsulation 104 can be used to cover the circuitry and can be formed from an encapsulant material or mold material.

The layers 112 can be formed from a non-conductive material or a solder resist and have a shape of a grid or a mesh. The layers 112 can include an optional base layer 116, non-horizontal strip patterns 122, and non-vertical strip patterns 126 over the optional base layer 116.

For illustrative purposes, the layers 112 are shown having the optional base layer 116. The optional base layer 116 can be omitted from the layers 112. The non-horizontal strip patterns 122 and the non-vertical strip patterns 126 could be formed directly on the substrate 102, as an example.

The non-horizontal strip patterns 122 and the non-vertical strip patterns 126 are formed above the optional base layer 116. Intersecting portions or sides of the non-horizontal strip patterns 122, of the non-vertical strip patterns 126, and of the optional base layer 116 can form crevices 128 in the layers 112.

For illustrative purposes, the crevices 128 are shown having shape of a rectangular. It is understood that the crevices 128 can have a different shape. For example, the crevices 128 can have a shape of a square, a trapezoid, a triangle, etc.

Spill zones 132 can be formed from the component areas 106 to portions of the layers 112. The spill zones 132 are defined as areas on or to the layers 112 used to vent and direct excess quantities of the encapsulant material expelled from the component areas 106 during manufacturing phases that can include an encapsulation forming phase.

The spill zones 132 can include an ingress end 134 and an egress end 136. During the manufacturing phases, the encapsulant material used to fill the component areas 106 are vented or released out of the component areas 106. The encapsulant material vented or released can enter the ingress end 134 and exit out the egress end 136 of each of the spill zones 132.

A mold flash is defined as an unintended formation of the encapsulant material or the mold material outside a perimeter of the layers 112 on the substrate 102. The crevices 128, the non-horizontal strip patterns 122, or the non-vertical strip patterns 126 in the layers 112 eliminate formation of the mold flash from protruding outside a perimeter of the layers 112 by providing a array of depressions and tiered surfaces that can block, confine, and redirect the flow of the encapsulant material during the manufacturing phases.

Figure 2:
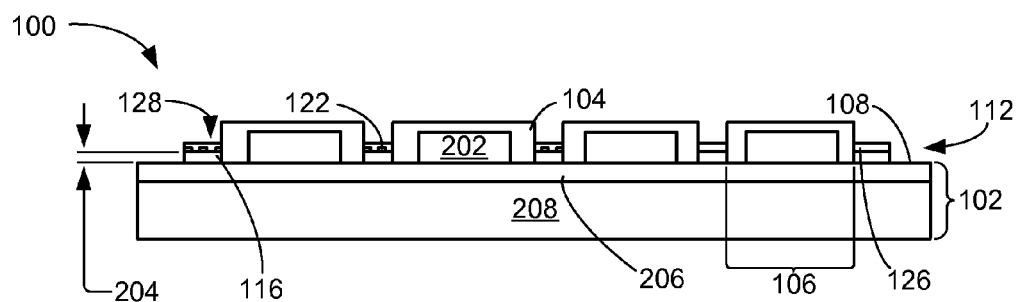
FIG. 2 is a cross-sectional view of FIG. 1 taken along line 2-2.

The layers 112 surrounding the encapsulation 104 covering an integrated circuit device 202 of FIG. 2 ensure elimination of the mold flash from edges of the substrate 102. The edges of the substrate 102 absent the mold flash enable the substrate 102 to be inserted in magazines (not shown) for usage in an automated process equipment (not shown) during manufacturing phases.

It has been discovered that the layers 112 including the non-horizontal strip patterns 122, and the non-vertical strip patterns 126 improve yield and reduce failures by restricting/limiting flow of the encapsulation 104 thereby eliminating the formation of the mold flash at or beyond an edge of the substrate 102.

It has been unexpectedly observed that the layers 112 formed using solder resist prevented the formation of the mold flash on ten test strip assemblies having the substrate 102 as compared to another ten of the test assemblies having the substrate 102 using the solder resist with typical patterns and all formed having the mold flash.

Referring now to FIG. 2, therein is shown a cross-sectional view of FIG. 1 taken along line 2-2. The integrated circuit packaging system 100 is shown with the integrated circuit device 202 mounted on the component side 108 of each of the component areas 106. The integrated circuit device 202 can be electrically connected to the substrate 102 including a copper traced substrate and covered by the encapsulation 104.

The optional base layer 116 is shown intersecting the encapsulation 104. A base layer thickness 204 is defined as a vertical distance from a side of the optional base layer 116 directly on the component side 108 of a copper traced layer 206 to a side of the optional base layer 116 opposite and facing away from the copper traced layer 206 of the substrate 102.

The substrate 102 can be formed with the copper traced layer 206 directly on a resin support layer 208. The resin support layer 208 can be formed from a mixture of materials that can include epoxy or fiberglass. The substrate 102 can optionally have internal layers of copper similar to the copper traced layer 206 to provide rigidity, structure, and additional signal connectivity and routing to the substrate 102.

The non-horizontal strip patterns 122 and the non-vertical strip patterns 126 can be formed over the optional base layer 116 and protruding above the optional base layer 116. The crevices 128 in the layers 112 are shown formed by the optional base layer 116, the non-horizontal strip patterns 122, and the non-vertical strip patterns 126 of the layers 112 of FIG. 1.

Figure 3:
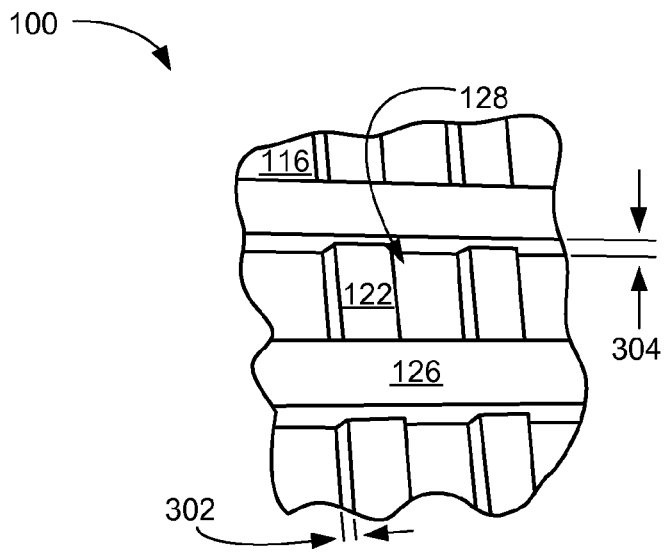
FIG. 3 is an isometric view of a portion of FIG. 1.

Referring now to FIG. 3, therein is shown an isometric view of a portion of FIG. 1. A detailed isometric view of a portion of the layers 112 of FIG. 1 is shown including the optional base layer 116, the non-horizontal strip patterns 122, and the non-vertical strip patterns 126.

A non-horizontal layer thickness 302 of the non-horizontal strip patterns 122 is defined as a distance perpendicular to and from a side of the non-horizontal strip patterns 122 facing the substrate 102 of FIG. 1 to a side of the non-horizontal strip patterns 122 opposite and facing away from the substrate 102.

A non-vertical layer thickness 304 of the non-vertical strip patterns 126 is defined as a distance perpendicular to and from a side of the non-vertical strip patterns 126 facing the substrate 102 of FIG. 1 to a side of the non-vertical strip patterns 126 opposite and facing away from the substrate 102.

The non-horizontal strip patterns 122 and the non-vertical strip patterns 126 are formed above the optional base layer 116. Intersecting portions or sides of the non-horizontal strip patterns 122, of the non-vertical strip patterns 126, and of the optional base layer 116 can form the crevices 128 in the layers 112.

The non-vertical layer thickness 304 is greater than the non-horizontal layer thickness 302. The crevices 128 of the layers 112 are below the side of the non-vertical strip patterns 126 opposite and facing away from the substrate 102.

For illustrative purposes, the crevices 128 are shown having shape of a rectangular. It is understood that the crevices 128 can have a different shape. For example, the crevices 128 can have a shape of a square, a trapezoid, a triangle, etc.

The non-horizontal strip patterns 122 and the non-vertical strip patterns 126 ensure elimination of the mold flash from edges of the substrate 102 of FIG. 1. The edges of the substrate 102 absent the mold flash enable the substrate 102 to be inserted in magazines (not shown) for usage in an automated process equipment (not shown) during manufacturing phases.

Figure 4:
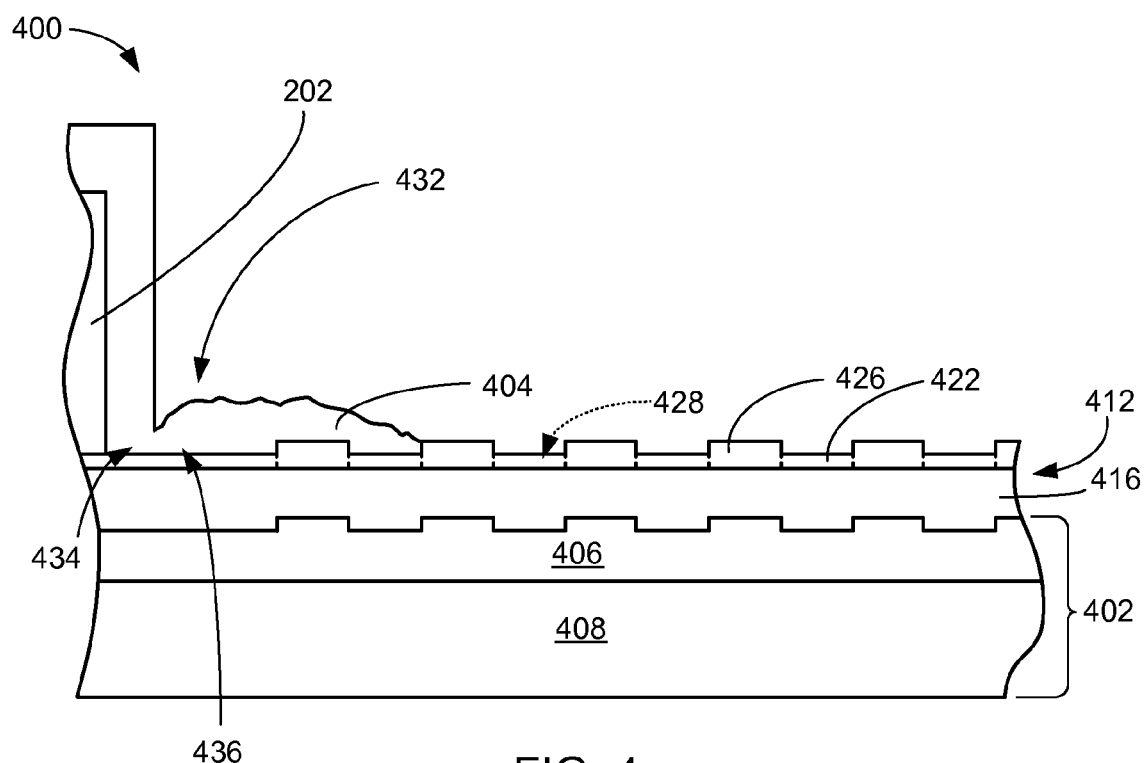
FIG. 4 is a cross-sectional view of an integrated circuit packaging system in a second embodiment of the present invention.

Referring now to FIG. 4, therein is shown a cross-sectional view of an integrated circuit packaging system 400 in a second embodiment of the present invention. The cross-sectional view is shown along a direction of flow of encapsulant material expelled or vented on to layers 412.

The integrated circuit packaging system 400 includes the integrated circuit device 202, a substrate 402 including a copper traced substrate, and an encapsulation 404 or a mold on the integrated circuit device 202 and on a portion of the layers 412 formed around the integrated circuit device 202. The layers 412 can include an optional base layer 416, non-horizontal strip patterns 422, and non-vertical strip patterns 426 over the optional base layer 116.

The encapsulation 404 is shown covering two of the non-horizontal strip patterns 422, one of the non-vertical strip patterns 426, and inside of crevices 428 (shown with hidden lines) of the layers 412 in a manner similar to the non-horizontal strip patterns 122 of FIG. 2 and the non-vertical strip patterns 126 of FIG. 2.

The encapsulation 404 in contact with the layers 412 is a result of the encapsulant material expelled through spill zones 432 having an ingress end 434 and an egress end 436. The ingress end 434 and the egress end 436 of the spill zones 432 can be formed and can function in a manner similar to the spill zones 132 of FIG. 1, the ingress end 134 of FIG. 1, and the egress end 136 of FIG. 1.

A copper traced layer 406 of the substrate 402 can be formed having lower regions for the non-horizontal strip patterns 422 providing upper regions for the non-vertical strip patterns 426. Alternating portions of the lower regions can be formed with the non-vertical strip patterns 426 in a manner similar to the structure of FIG. 3.

It has been discovered that the lower regions and the upper regions provide improved patterning and differentiation of the non-horizontal strip patterns 422 and the non-vertical strip patterns 426 restricting/limiting flow of the encapsulation 404 thereby eliminating the formation of the mold flash at or beyond an edge of the substrate 402.

The substrate 402 can be formed with the copper traced layer 406 directly on a resin support layer 408. The resin support layer 408 can be formed from a mixture of materials that can include epoxy or fiberglass. The substrate 402 can optionally have internal layers of copper similar to the copper traced layer 406 to provide rigidity, structure, and additional signal connectivity and routing to the substrate 402.

For illustrative purposes, the optional base layer 416 is shown having a planar top side, although the top side may be patterned in a manner similar to the non-horizontal strip patterns 422 and the non-vertical strip patterns 426. For example, the optional base layer 416 can be formed with a uniform thickness and conformal to an upper portion of the copper traced layer 406 resulting in the top side formed having the non-horizontal strip patterns 422, the non-vertical strip patterns 426, and the crevices 428.

Figure 5:
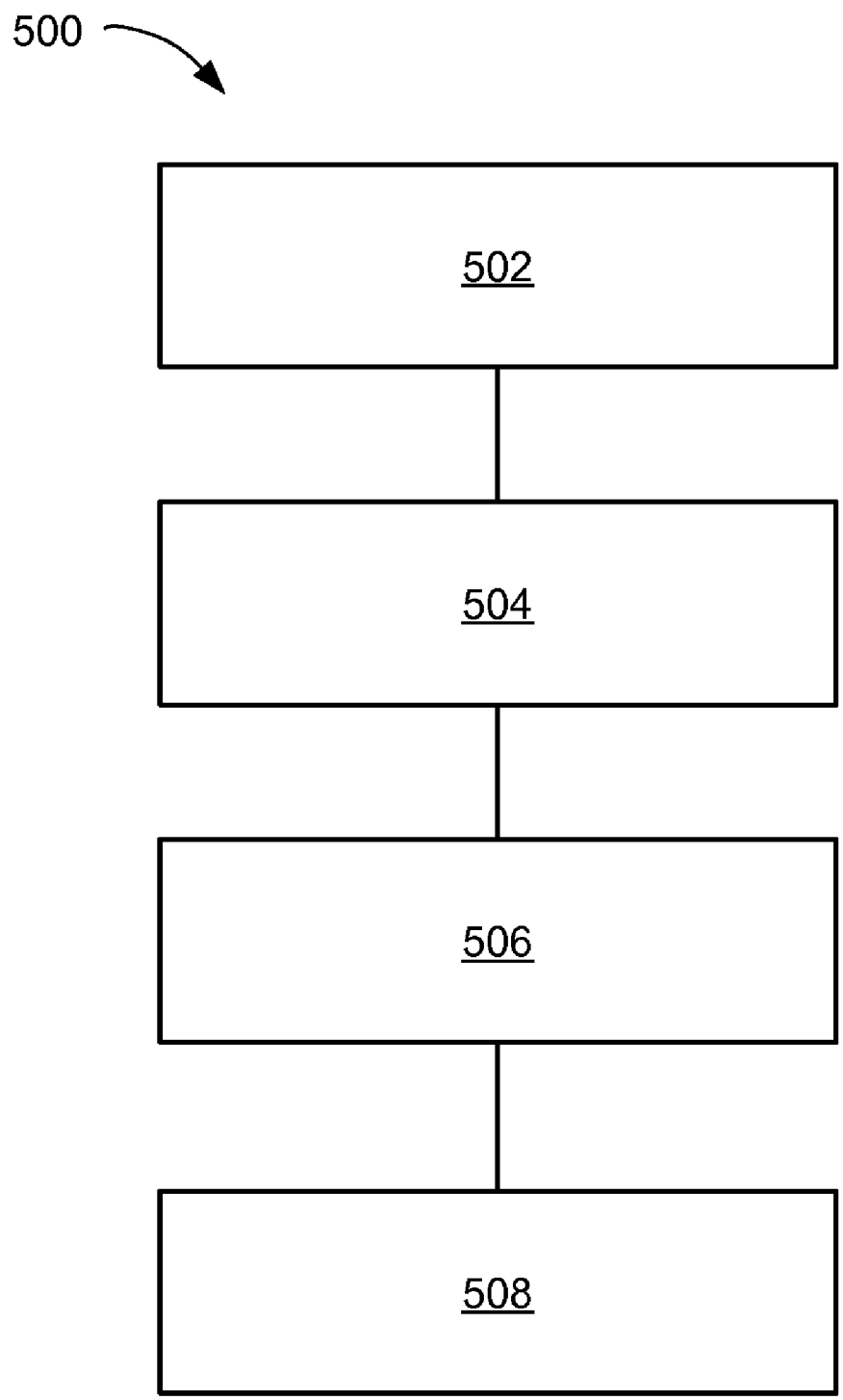
FIG. 5 is a flow chart of a method of manufacture of the integrated circuit packaging system in a further embodiment of the present invention.

Referring now to FIG. 5, therein is shown a flow chart of a method 500 of manufacture of the integrated circuit packaging system 100 in a further embodiment of the present invention. The method 500 includes: providing a substrate in a block 502; forming layers having non-horizontal strip patterns and non-vertical strip patterns over the substrate in a block 504; mounting an integrated circuit device on the substrate adjacent the non-horizontal strip patterns and the non-vertical strip patterns in a block 506; and applying an encapsulation over the integrated circuit device, the encapsulation restricted by the layers to prevent the encapsulation from reaching an edge of the substrate in a block 508.

In greater detail, a system to provide the method and apparatus of the integrated circuit packaging system 100, in an embodiment of the present invention, is performed as follows:

1. Providing a substrate.
2. Forming layers having a cavity, non-horizontal strip patterns, and non-vertical strip patterns.
3. Mounting an integrated circuit device on the substrate adjacent the cavity, the non-horizontal strip patterns and the non-vertical strip patterns.
4. Applying an encapsulation over the integrated circuit device, the encapsulation is restricted by the layers to prevent the encapsulation from reaching an edge of the substrate.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing package in package systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a substrate;
   forming layers having non-horizontal strip patterns and non-vertical strip patterns over the substrate;
   mounting an integrated circuit device on the substrate adjacent the non-horizontal strip patterns and the non-vertical strip patterns; and
   applying an encapsulation over the integrated circuit device, the encapsulation restricted by the layers to prevent the encapsulation from reaching an edge of the substrate.

2. The method as claimed in claim 1 further comprising forming a crevice with sides of the non-horizontal strip patterns intersected by sides of the non-vertical strip patterns.

3. The method as claimed in claim 1 wherein applying the encapsulation includes forming the encapsulation adjacent a spill zone and over the layers.

4. The method as claimed in claim 1 wherein providing the substrate includes providing the substrate having a copper traced layer.

5. The method as claimed in claim 1 further comprising inserting the substrate having the integrated circuit device and the encapsulation in an automated process device.

6. A method of manufacture of an integrated circuit packaging system comprising:
providing a substrate;
forming layers having a cavity, non-horizontal strip patterns, and non-vertical strip patterns;
mounting an integrated circuit device on the substrate adjacent the cavity, the non-horizontal strip patterns and the non-vertical strip patterns; and
applying an encapsulation over the integrated circuit device, the encapsulation restricted by the layers to prevent the encapsulation from reaching an edge of the substrate.

7. The method as claimed in claim 6 further comprising forming a crevice by sides of the non-vertical strip patterns intersecting sides of the non-horizontal strip patterns below the sides of the non-vertical strip patterns opposite and facing away from the substrate.

8. The method as claimed in claim 6 wherein applying the encapsulation includes forming the encapsulation adjacent a spill zone, in the spill zone, and on a portion of the layers.

9. The method as claimed in claim 6 wherein providing the substrate includes providing the substrate having a resin support layer.

10. The method as claimed in claim 6 further comprising inserting the substrate having the integrated circuit device and the encapsulation in a magazine for an automated process device.

11. An integrated circuit packaging system comprising:
a substrate;
layers having non-horizontal strip patterns and non-vertical strip patterns over the substrate;
an integrated circuit device on the substrate adjacent the non-horizontal strip patterns and the non-vertical strip patterns; and
an encapsulation over the integrated circuit device, the encapsulation restricted by the layers to prevent the encapsulation from reaching an edge of the substrate.

12. The system as claimed in claim 11 further comprising a crevice formed by sides of the non-horizontal strip patterns intersecting sides of the non-vertical strip patterns.

13. The system as claimed in claim 11 wherein the encapsulation includes the encapsulation adjacent a spill zone and to the layers.

14. The system as claimed in claim 11 wherein the substrate includes a copper traced layer.

15. The system as claimed in claim 11 wherein the substrate having the integrated circuit device and the encapsulation is in an automated process device.

16. The system as claimed in claim 11 further comprising a cavity formed by the non-horizontal strip patterns and the non-vertical strip patterns and adjacent the integrated circuit device.

17. The system as claimed in claim 16 further comprising a crevice formed by sides of the non-vertical strip patterns intersecting sides of the non-horizontal strip patterns below the sides of the non-vertical strip patterns opposite and facing away from the substrate.

18. The system as claimed in claim 16 wherein the encapsulation includes the encapsulation adjacent a spill zone, in the spill zone, and on a portion of the layers.

19. The system as claimed in claim 16 wherein the substrate includes a resin support layer.

20. The system as claimed in claim 16 wherein the substrate having the integrated circuit device and the encapsulation is in a magazine of an automated process device.

* * * * *